(12) United States Patent
Hsiao

(10) Patent No.: US 8,975,157 B2
(45) Date of Patent: Mar. 10, 2015

(54) CARRIER BONDING AND DETACHING PROCESSES FOR A SEMICONDUCTOR WAFER

(75) Inventor: Wei-Min Hsiao, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 209 days.

(21) Appl. No.: 13/369,204

(22) Filed: Feb. 8, 2012

(65) Prior Publication Data

US 2013/0203265 A1    Aug. 8, 2013

(51) Int. Cl.
*H01L 21/00* (2006.01)

(52) U.S. Cl.
USPC .......................................... 438/455; 438/459

(58) Field of Classification Search
USPC ................................................ 438/455–459
See application file for complete search history.

(56) References Cited

U.S. PATENT DOCUMENTS

| | | | |
|---|---|---|---|
| 3,761,782 A | 9/1973 | Youmans | |
| 4,394,712 A | 7/1983 | Anthony | |
| 4,499,655 A | 2/1985 | Anthony | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,166,097 A | 11/1992 | Tanielian | |
| 5,191,405 A | 3/1993 | Tomita et al. | |
| 5,229,647 A | 7/1993 | Gnadinger | |
| 5,239,448 A | 8/1993 | Perkins et al. | |
| 5,308,443 A | 5/1994 | Sugihara | |
| 5,404,044 A | 4/1995 | Booth et al. | |
| 5,615,477 A | 4/1997 | Sweitzer | |
| 5,643,831 A | 7/1997 | Ochiai et al. | |
| 5,998,292 A | 12/1999 | Black et al. | |
| 6,276,599 B1 | 8/2001 | Ogawa | |
| 6,329,631 B1 | 12/2001 | Yueh | |
| 6,406,934 B1 | 6/2002 | Glenn et al. | |
| 6,448,506 B1 | 9/2002 | Glenn et al. | |
| 6,457,633 B1 | 10/2002 | Takashima et al. | |
| 6,577,013 B1 | 6/2003 | Glenn et al. | |
| 6,670,269 B2 | 12/2003 | Mashino | |

(Continued)

FOREIGN PATENT DOCUMENTS

| CN | 1528009 A | 9/2004 |
|---|---|---|
| JP | 2002246540 A | 8/2002 |

(Continued)

OTHER PUBLICATIONS

SIPO Office Action with translation of search report, dated Aug. 19, 2014, for Chinese Patent Application No. 2012104965353.

*Primary Examiner* — Richard Booth
(74) *Attorney, Agent, or Firm* — Morgan Law Offices, PLC

(57) ABSTRACT

The present invention provides a temporary carrier bonding and detaching process. A first surface of a semiconductor wafer is mounted on a first carrier by a first adhesive, and a first isolation coating is disposed between the first adhesive and the first carrier. Then, a second carrier is mounted on the second surface of the semiconductor wafer. The first carrier is detached. The method of the present invention utilizes the second carrier to support and protect the semiconductor wafer, after which the first carrier is detached. Therefore, the semiconductor wafer will not be damaged or broken, thereby improving the yield rate of the semiconductor process. Furthermore, the simplicity of the detaching method for the first carrier allows for improvement in efficiency of the semiconductor process.

12 Claims, 16 Drawing Sheets

(56) References Cited

U.S. PATENT DOCUMENTS

| | | |
|---|---|---|
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,134,198 B2 | 11/2006 | Nakatani |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0029224 A1 | 2/2005 | Aspar |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0138562 A1 | 6/2007 | Trezza |
| 2007/0155129 A1 | 7/2007 | Thallner |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0218560 A1 | 9/2009 | Flaim |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0227454 A1 | 9/2010 | Dohmae |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0263794 A1 | 10/2010 | George |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0230005 A1 | 9/2011 | Vaufredaz |

FOREIGN PATENT DOCUMENTS

| | | |
|---|---|---|
| JP | 2004228135 A | 8/2004 |
| KR | 1020090098563 A | 9/2009 |
| TW | 200612539 A | 4/2006 |
| WO | 2011004659 A1 | 1/2011 |

CARRIER BONDING AND DETACHING PROCESSES FOR A SEMICONDUCTOR WAFER

BACKGROUND OF THE INVENTION

1. Field of the Invention

The present invention relates generally to semiconductor device manufacturing, and more particularly, to handling and transport of semiconductor wafers during manufacturing.

2. Description of the Related Art

Handling semiconductor wafers that are in an intermediate state of fabrication as they are transported from one manufacturing site to another requires extreme care such that damage to the wafers is prevented. Conventionally, wafer chucks are mounted on surfaces of the wafer or carrier. However, this process can damage the wafer particularly when the chucks are detached from the wafer. As efforts to reduce the thickness of semiconductor wafers continue, improved techniques for their handling and transport will become increasingly important.

SUMMARY OF THE INVENTION

One aspect of the disclosure relates to a method for handling a semiconductor wafer. In one embodiment, the method for handling a semiconductor wafer comprises attaching a carrier to the semiconductor wafer; separating the semiconductor wafer into an inner portion and an outer portion, the carrier requiring substantially less pulling force to be removed from the inner portion than the outer portion; and removing the carrier from the inner portion of the semiconductor wafer. Separation of the semiconductor wafer into the inner portion and the outer portion can be accomplished by cutting the semiconductor wafer into the inner portion and the outer portion using a blade or a laser. In an embodiment, the method for handling the semiconductor wafer includes adhesively attaching the carrier to an active surface of the semiconductor wafer, wherein an adhesive bonds the active surface of the semiconductor wafer to an isolation coating disposed on a surface of the carrier and a portion of the surface of the carrier not having the isolation coating. To allow for easy detachment of the inner portion, the adhesive strength of a bond between the active surface of the semiconductor wafer and the isolation coating is substantially less than the adhesive strength of a bond between the semiconductor wafer and the portion of the surface of the carrier not having the isolation coating.

The method is particularly suitable for semiconductor wafers that employ through silicon via (TSV) technology. In an embodiment the method for handling the semiconductor wafer further comprises, after attaching the carrier to the active surface of the semiconductor wafer, exposing a tip of at least one conductive pillar formed in the semiconductor wafer by removing a portion of an inactive surface of the semiconductor wafer; covering the exposed tips with a passivation layer; and thinning the passivation layer so that the tips protrude from the passivation layer. To further secure the wafer, the method further comprises attaching an inactive surface of the semiconductor wafer to a first surface of a dicing tape.

Another aspect of the disclosure relates to a method for handling a semiconductor wafer, comprising attaching a carrier to an active surface of the semiconductor wafer using a first adhesive, so that the first adhesive is disposed between the active surface of the semiconductor wafer and an isolation coating disposed on a surface of the carrier and a second adhesive disposed on a portion of the surface of the carrier not having the isolation coating; dissolving the second adhesive; and removing the carrier from the semiconductor wafer.

Another aspect of the disclosure relates to a method for handling a semiconductor wafer, comprising attaching a first carrier to an active surface of the semiconductor wafer using a first adhesive, so that the first carrier includes a first isolation coating disposed between the first carrier and the first adhesive, wherein the area of the first isolation coating is smaller than that of the first adhesive; forming a second adhesive on an inactive surface of the semiconductor wafer; forming a second carrier on the second adhesive, wherein the second carrier is a polymer layer; and detaching the first carrier and the first isolation coating from the semiconductor wafer.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
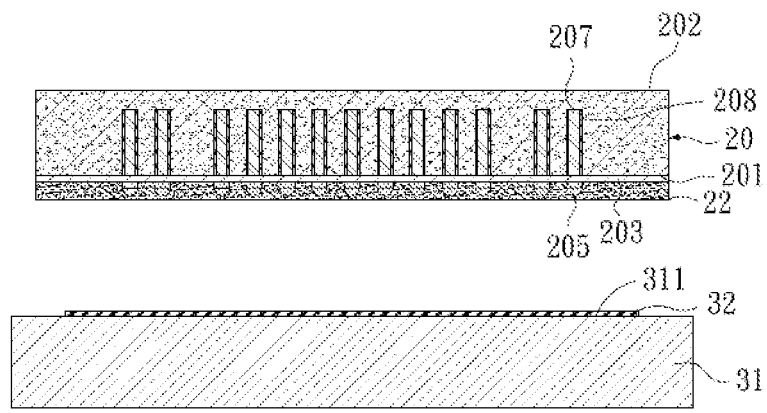
FIGS. 1-14 illustrate a temporary carrier bonding and detaching process according to an embodiment of the present invention.

Referring to FIG. 1, a semiconductor wafer 20 (shown in a cross-sectional view) being prepared for handling and transportation, according to an embodiment of the present invention, is illustrated. The semiconductor wafer 20 has a first surface 201, a second surface 202 and a plurality of conductive pillars 207. The semiconductor wafer 20 can be made from silicon, germanium, gallium arsenide, etc., and the conductive pillars 207 made of a suitable conductive material such as copper. In this embodiment, the semiconductor wafer 20 is fully fabricated to include an integrated circuit 203 on the first surface 201 and the conductive pillars 207 (as shown), so that the first surface 201 is defined as an active surface, and the second surface 202 is defined as an inactive surface. However, it is to be understood that the semiconductor wafer 20 may be an interposer having only the conductive pillars 207. To avoid placing conductive metal directly on the semiconductor material, an insulation material 208, such as a non-conductive polymer, including polyimide (PI), epoxy or benzocyclobutene (BCB), or an inorganic material, such as, silicon dioxide ($SiO_2$), is formed between the semiconductor material and the conductive pillars 207.

In this embodiment, the integrated circuit 203, such as a CMOS circuit, is formed on the first surface 201 and may include a redistribution layer (RDL), and conductive elements 205 are formed on the integrated circuitry 203 and electronically connected to the conductive pillars 207.

A first adhesive 22 is applied to the first surface 201 of the semiconductor wafer 20. In this embodiment, the first adhesive 22 is disposed on the integrated circuit 203, and includes a solvent-dissolving adhesive. Exemplary solvent-dissolving adhesives include the X5000 and X5300 brands of adhesives by SUMITOMO CHEMICAL.

Additionally, a first carrier 31 is provided, which can be a semiconductor material or insulating material such as glass. The first carrier 31 has a first isolation coating 32 disposed on a surface 311 thereof. In this embodiment, the first isolation coating 32 is a hydrophobic coating.

Figure 2:
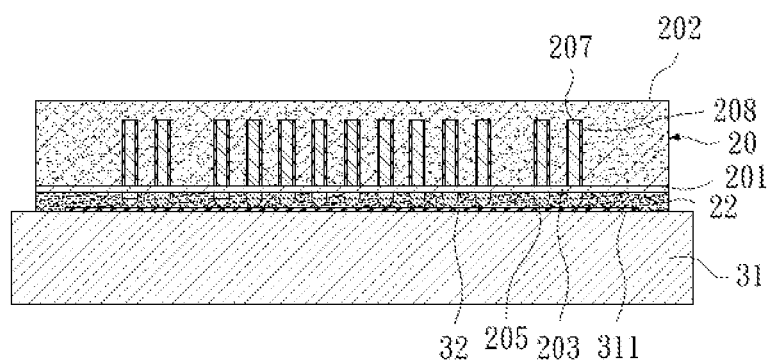

Referring to FIG. 2, the first surface 201 of the semiconductor wafer 20 is attached to the first carrier 31, and the semiconductor wafer 20 is adhered to the first carrier 31 by the first adhesive 22. The first isolation coating 32 has a characteristic that the adhesion force between the first isolation coating 32 and the first adhesive 22 is weak. In this embodiment, the conductive elements 205 are embedded into the first adhesive 22, and the thickness of the first adhesive 22 is larger than the thickness of the conductive elements 205. The area of the first isolation coating 32 is slightly smaller than that of the first adhesive 22. In this embodiment, the adhesion force with respect to the first adhesive 22 and the first carrier 31 is greater than the adhesion force with respect to the first adhesive 22 and the isolation coating 32.

Figure 3:
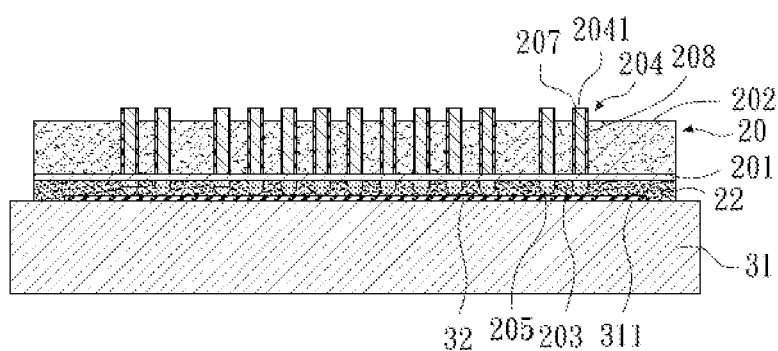

Referring to FIG. 3, a surface treatment is conducted on the second surface 202 of the semiconductor wafer 20. The second surface 202 of the semiconductor wafer 20 is thinned by grinding and/or etching, so that the conductive pillars 207 protrude from the upper surface of the semiconductor wafer 20, and a plurality of conductive vias 204 are formed. Thus, a tip 2041 of each of the conductive vias 204, which may include both portions of the insulation material 208 and conductive pillar 207, is exposed.

Figure 4:
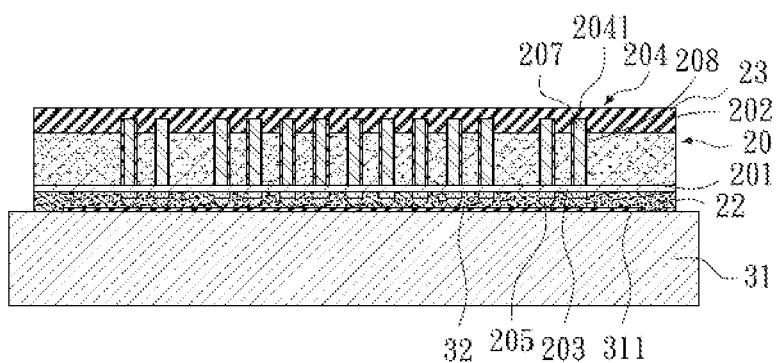

Referring to FIG. 4, a passivation layer 23 is formed on the second surface 202 by a laminating process or a spin coating process, for example, so as to cover the tips 2041 of the conductive vias 204. The passivation layer 23 may be a non-conductive polymer such as polyimide (PI), epoxy or benzocyclobutene (BCB). Alternatively, an inorganic passivation layer, such as, silicon dioxide ($SiO_2$), may be used. In this embodiment, the passivation layer 23 can be a photo sensitive polymer such as benzocyclobutene, and can be formed by spin coating or spray coating.

Figure 5:
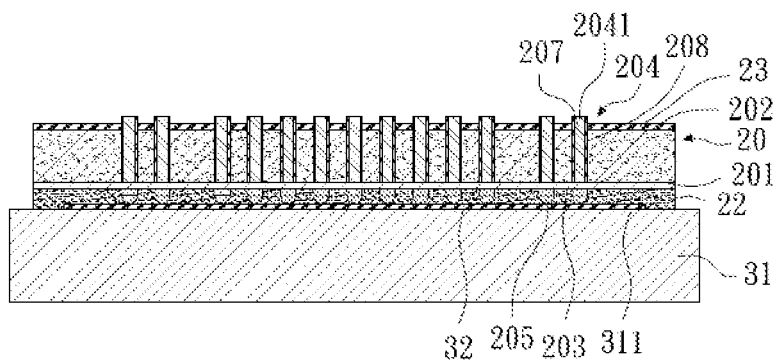

Referring to FIG. 5, the passivation layer 23 is thinned by grinding and/or etching, so that the tips 2041 of the conductive vias 204 protrude from the passivation layer 23. That is, portions of the passivation layer 23 remain on the second surface 202 of the semiconductor wafer 20 and fill in or interlace the areas between the tips 2041.

Figure 6:
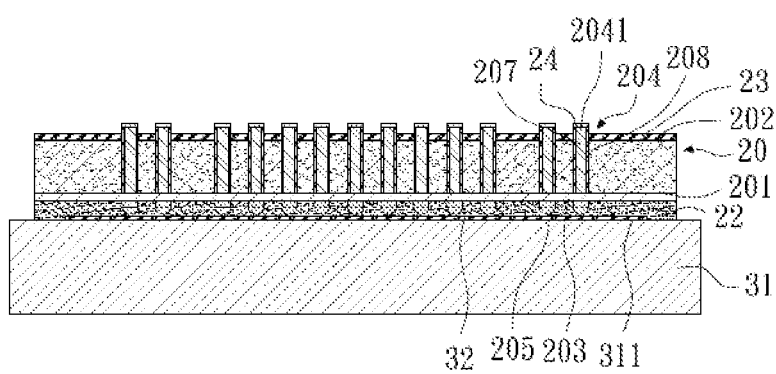

Referring to FIG. 6, a finish layer 24 is formed on the tips 2041 of the conductive vias 204 by electroplating. In this embodiment, the surface finish layer 24 has a stacked metal layer structure, such as a nickel/gold (Ni/Au) layer or a nickel/palladium/gold (Ni/Pd/Au) layer.

Figure 7:
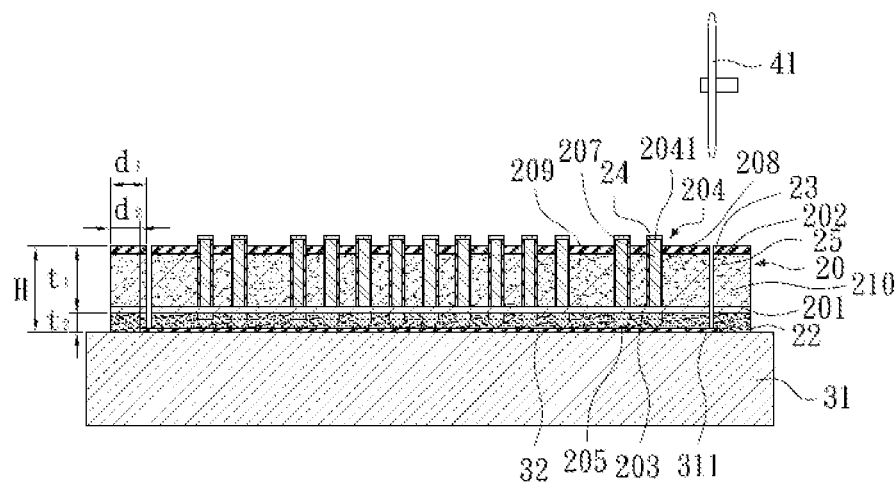

Referring to FIG. 7, a peripheral part of the semiconductor wafer 20 and the first adhesive 22 is removed to form a circular groove 25 so as to expose a part of the first isolation coating 32. The semiconductor wafer 20 is then divided into an inner portion 209 and an outer portion 210. After the circular groove 25 is formed, the inner portion 209 is attached to the first isolation coating 32 substantially entirely by the first adhesive 22 allowing for easier detachment of the inner portion 209 from the first carrier 31. In this embodiment, in order to remove most of the first adhesive 22 within the circular groove 25, the depth H of the circular groove 25 is equal to the sum of the thickness $t_1$ of the semiconductor wafer 20, the thickness $t_2$ of the first adhesive 22 and a tolerance of 10 μm, that is, $H=t_1+t_2\pm 10$ μm. In this embodiment, the semiconductor wafer 20 and the first adhesive 22 are cut by a blade 41 from the second surface 202 of the semiconductor wafer 20, and the surface area of the inner portion 209 is slightly less than that of the first isolation coating 32.

Figure 8:
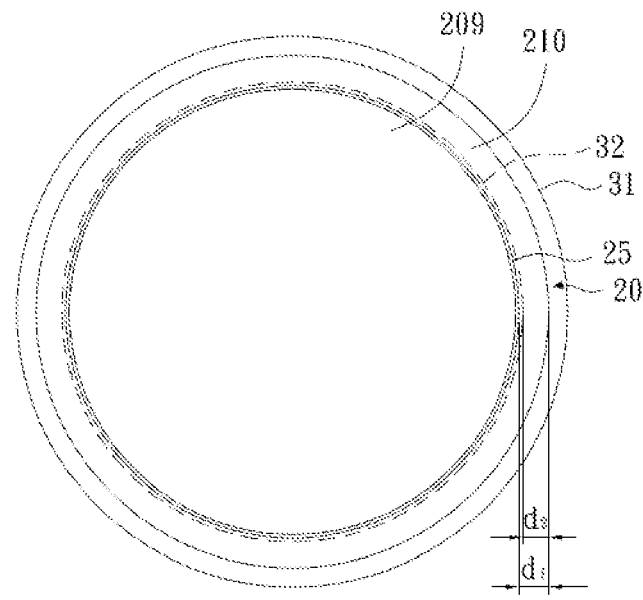

Referring to FIG. 8, in order to expose a part of the first isolation coating 32, a distance $d_1$ between the circular groove 25 and an edge of the semiconductor wafer 20 is slightly greater than a distance $d_2$ between an edge of first isolation coating 32 and the edge of the semiconductor wafer 20, so that the circular groove 25 is formed on the first isolation coating 32. In this embodiment, the difference between $d_1$ and $d_2$ is in a range from 400 μm to 600 μm.

Figure 9:
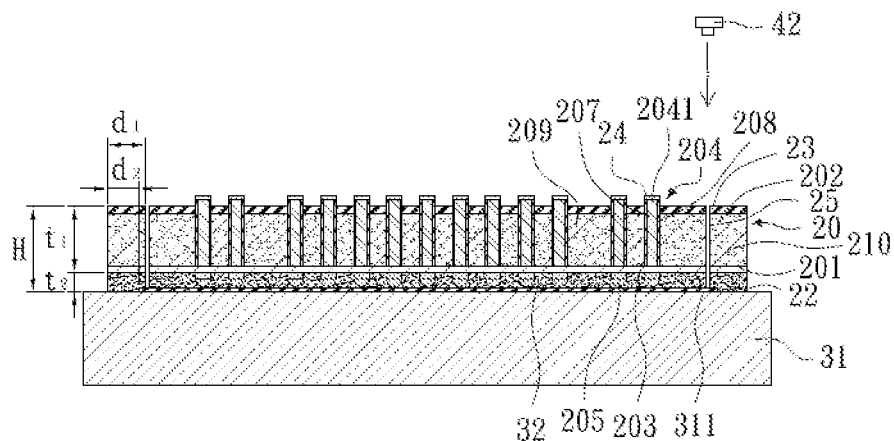

Referring to FIG. 9, alternatively, a laser 42 may be used to cut the semiconductor wafer 20 and the first adhesive 22 to form the circular groove 25.

Figure 10:
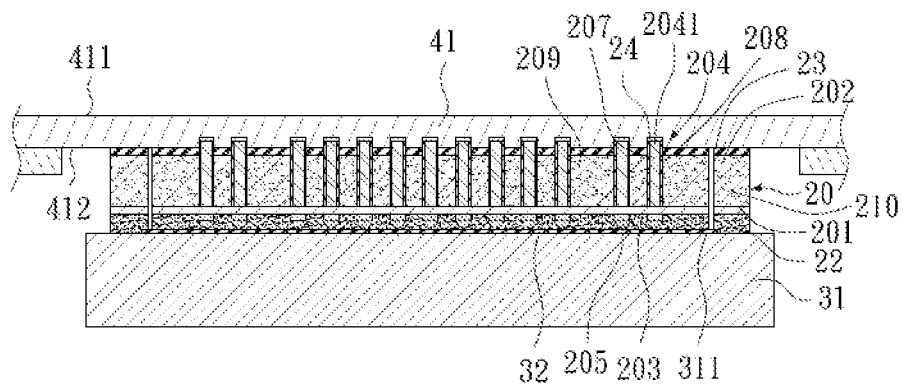

Referring to FIG. 10, a second carrier is provided. In this embodiment, the second carrier is a dicing tape 41 which has a first surface 411, a second surface 412 and an ultraviolet-released adhesive layer (not shown) disposed on the second surface 412. The second surface 412 of a dicing tape 41 is attached to the second surface 202 of the semiconductor wafer 20 through the ultraviolet-released adhesive layer and the tips 2041 of the conductive vias 204 are embedded into the ultraviolet-released adhesive layer.

Figure 11:
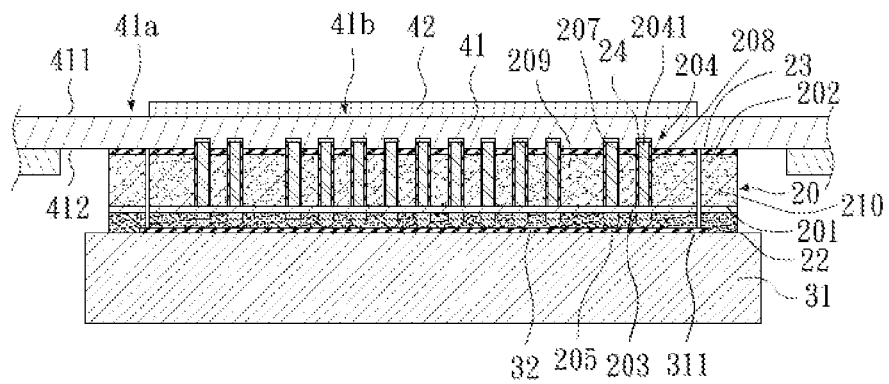

Referring to FIG. 11, a cover layer 42 is provided on a first surface 411 of the dicing tape 41. The cover layer 42 is an opaque layer and the size and position of the cover layer 42 corresponds to the inner portion 209 of the semiconductor wafer 20, and is used as a photomask layer.

Figure 12:
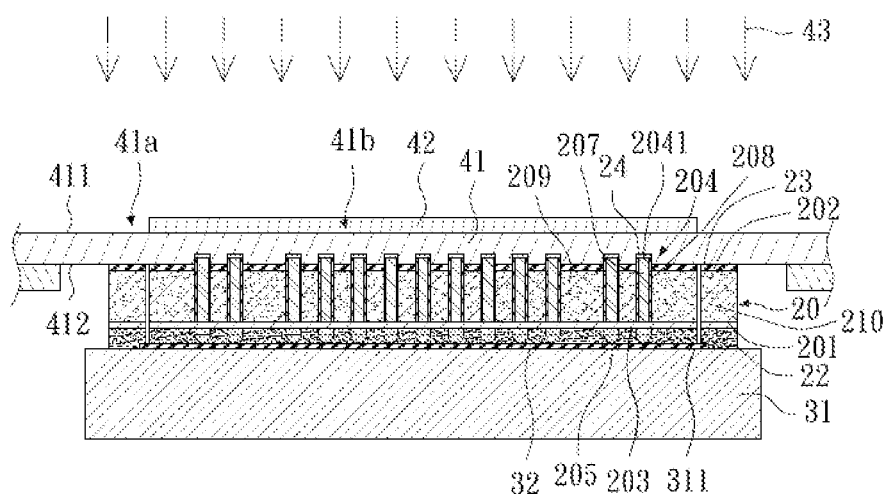

Referring to FIG. 12, a first portion 41a of the first surface 411 that is outside the cover layer 42 is illuminated by the ultraviolet light 43. Accordingly, the adhesive strength of the ultraviolet-released adhesive layer on the first portion 41a is significantly reduced; and a second portion 41b of the dicing tape 41 that is covered by the cover layer 42, and, therefore not illuminated by the ultraviolet light 43, retains its adhesive strength.

Figure 13:
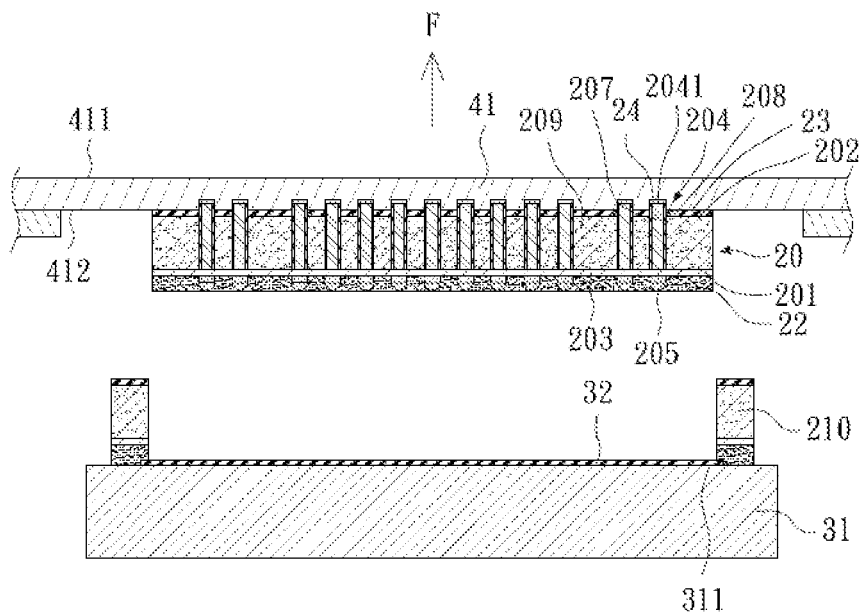

Referring to FIG. 13, the first carrier 31 is fixed and a pulling force F is applied to the dicing tape 41. In this embodiment, the pulling force F is larger than the adhesion force between the first adhesive 22 and the isolation coating 32, so that the first carrier 31, the first isolation coating 32 and the outer ring portion 210 of the semiconductor wafer 20 are detached from the dicing tape 41 and the inner portion 209 of the semiconductor wafer 20 simultaneously.

Figure 14:
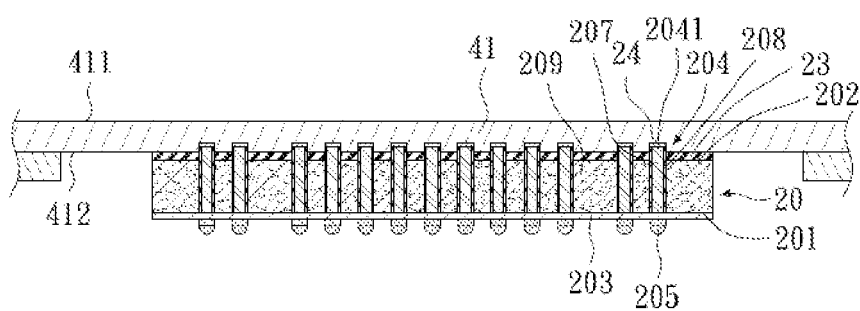

Referring to FIG. 14, the residual first adhesive 22 is removed from the semiconductor wafer 20 by a solvent, such as, gamma-Butyrolactone (GBL) or Propylene Glycol Monomethyl Ether Acetate (PGMEA), so that the conductive elements 205 are exposed.

Advantageously, this embodiment utilizes the second carrier (the dicing tape 41) to support and protect the semiconductor wafer 20 after the detaching of the first carrier 31. This enhanced handling process makes it less likely that the semiconductor wafer 20 will be damaged, thereby increasing the yield rate of the semiconductor process. Moreover, the support provided by the second carrier (the dicing tape 41) facilitates the process of cleaning the residual first adhesive 22. Furthermore, the cutting process performed by the blade 41 or laser 42 described above can greatly accelerate the first carrier 31 detaching rate.

Referring to FIGS. 15-18, a temporary carrier bonding and detaching process according to another embodiment of the present invention is illustrated. This embodiment is similar to the processes described above; however, the step of cutting the semiconductor wafer 20 and the first adhesive 22 is different.

Figure 15:
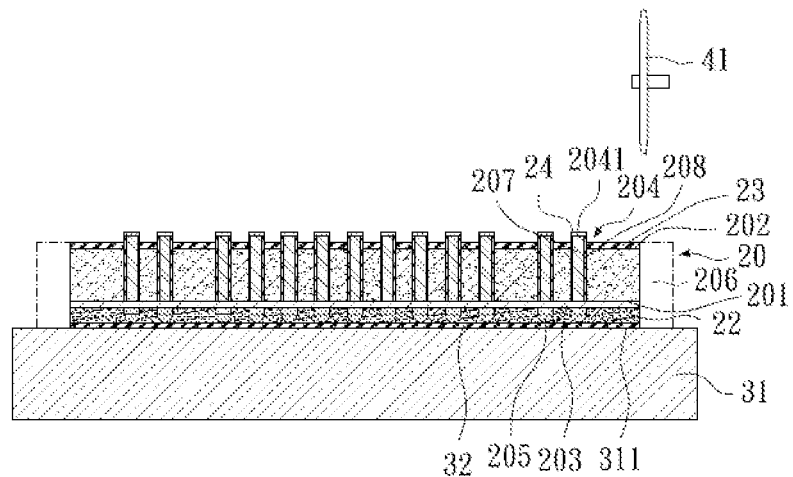
FIGS. 15-18 illustrate a temporary carrier bonding and detaching process according to another embodiment of the present invention.

Referring to FIG. 15, a peripheral part of the semiconductor wafer 20 and the first adhesive 22 is removed so as to expose a part of the first isolation coating 32. However, in this embodiment, an outermost peripheral part 206 of the semiconductor wafer 20 and the first adhesive 22 are cut and removed by the blade 41 from the second surface 202 of the semiconductor wafer 20 until the first isolation coating 32 is exposed. Preferably, a small part of the edge of the first isolation coating 32 may be cut away at the same time, so as to ensure that there is no first adhesive 22 on the surface 311 of the first carrier 31.

Figure 16:
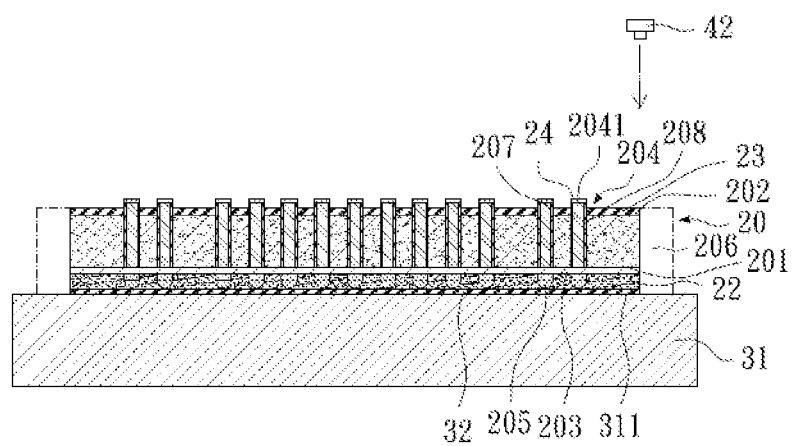

Referring to FIG. 16, alternatively, the outermost peripheral part 206 of the semiconductor wafer 20 and the first adhesive 22 may be cut away by a laser 42.

Figure 17:
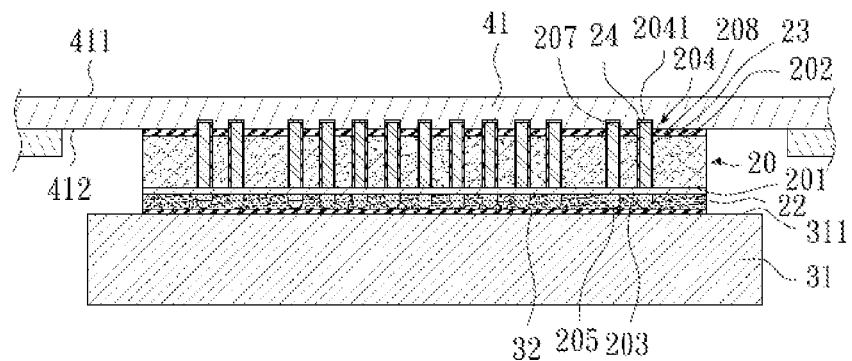

Referring to FIG. 17, a second surface 412 of a dicing tape 41 is attached to the second surface 202 of the semiconductor wafer 20 through a adhesive layer (not shown) and the tips 2041 of the conductive vias 204 are embedded into the adhesive layer.

Figure 18:
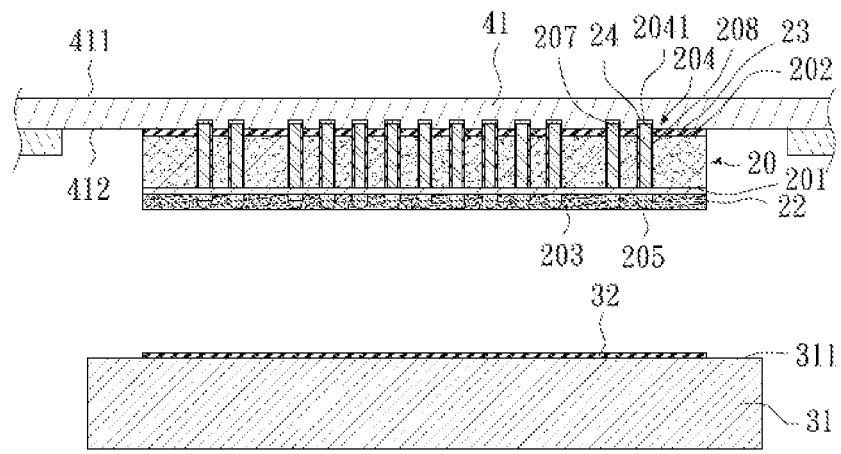

Referring to FIG. 18, the first carrier 31 and the first isolation coating 32 are detached from the semiconductor wafer 20 simultaneously. Then, the first adhesive layer 22 is immersed in a solvent, for example, gamma-Butyrolactone (GBL) or Propylene Glycol Monomethyl Ether Acetate (PGMEA). The solvent dissolves the first adhesive layer 22; thereupon, the first surface 201 of the semiconductor wafer 20 is exposed.

The dicing tape 41 remains with the semiconductor wafer 20 so as to permit the semiconductor wafer 20 to be handled and/or transported from one manufacturing station to another.

Referring to FIGS. 19-23, a temporary carrier bonding and detaching process according to another embodiment of the present invention is illustrated. This embodiment is similar to the processes described above; however, the steps of applying a second carrier are different.

Figure 19:
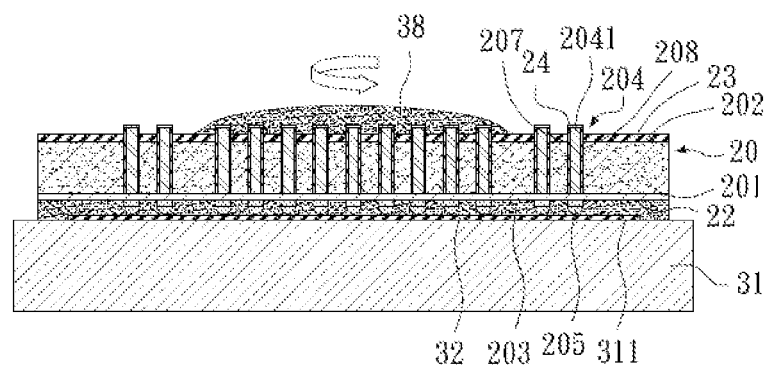
FIGS. 19-24 illustrate a temporary carrier bonding and detaching process according to another embodiment of the present invention.

Referring to FIG. 19, after a finish layer 24 had been formed on the tips 2041 of the conductive vias 204 by electroplating, a second adhesive 38 is formed on the second surface 202 of the semiconductor wafer 20 and covers the tips 2041 of the conductive vias 204. In this embodiment, the second adhesive 38 is a solvent-dissolving adhesive and may be the same as the first adhesive layer 22.

Figure 20:
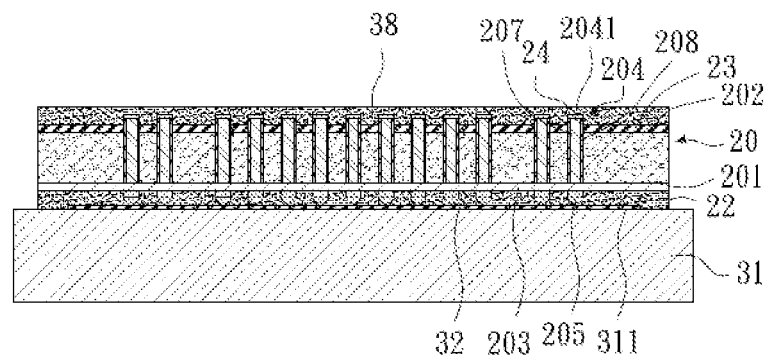

Referring to FIG. 20, the second adhesive 38 is formed by spin coating or spray coating and an area of the second adhesive 38 is the same as that of the semiconductor wafer 20.

Figure 21:
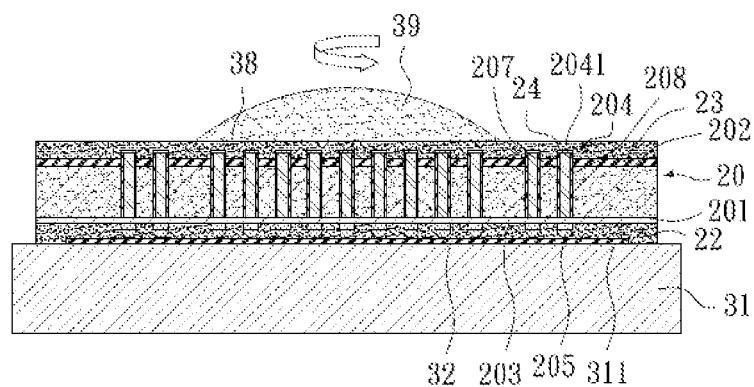

Referring to FIG. 21, a polymer layer 39 is formed on the second adhesive 38 by spin coating or spray coating. The polymer layer 39 and the second adhesive 38 are substantially different materials. In this embodiment, the polymer layer 39 is made by such as epoxy resin, molding compound, bismaleimide-triazine (BT) resin, benzocyclobutene (BCB), polybezoxazole (PBO) or polyimide (PI).

Figure 22:
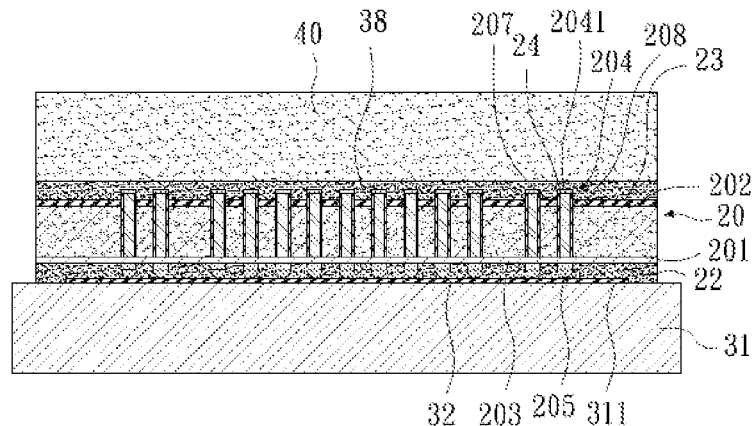

Referring to FIG. 22, after curing, the polymer layer 39 becomes a second carrier 40. In this embodiment, the area of the second carrier 40 is the same as that of the second adhesive 38, and in order to permit the semiconductor wafer 20 to be handled and/or transported from one manufacturing station to another, the second carrier 40 is substantially thicker than the second adhesive 38.

Figure 23:
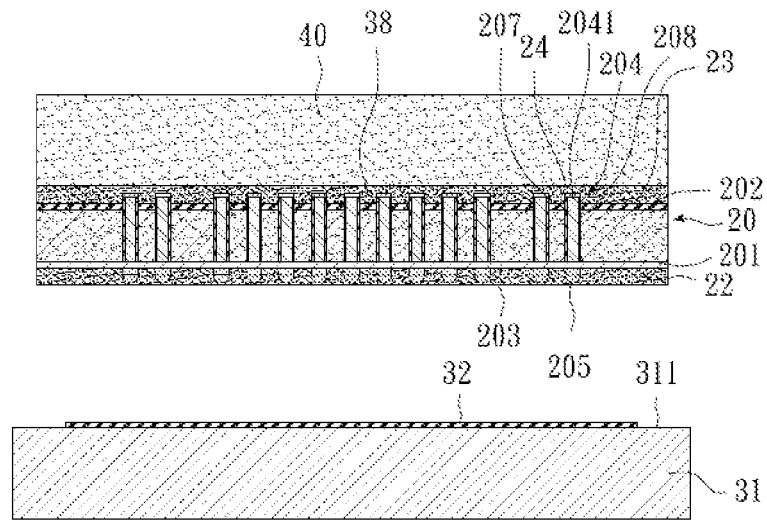

Referring to FIG. 23, the semiconductor wafer 20, the first adhesive layer 22 and the first carrier 31 are then immersed into a solvent, for example, gamma-Butyrolactone (GBL) or Propylene Glycol Monomethyl Ether Acetate (PGMEA), then, part of the first adhesive 22 is dissolved and part of the first isolation coating 32 is exposed. After that, the first carrier 31 and the isolation coating 32 are easily detached from the semiconductor wafer 20 simultaneously due to the weak adhesion force between the first adhesive 22 and the isolation coating 32. The second carrier 40 remains with the semiconductor wafer 20 so as to permit the semiconductor wafer 20 to be handled and/or transported from one manufacturing station to another.

Figure 24:
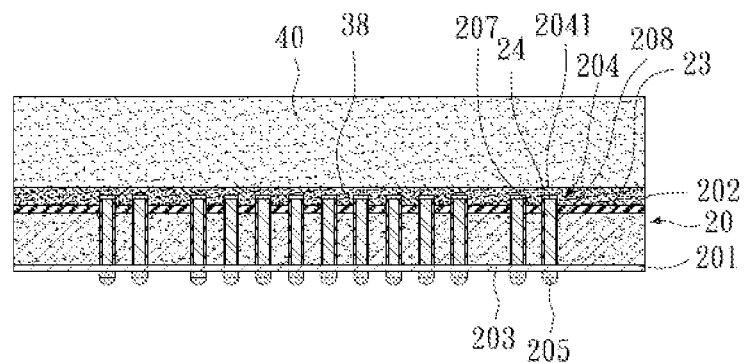

Referring to FIG. 24, after detaching the first carrier 31, the residual first adhesive 22 is removed from the semiconductor wafer 20 so that the conductive elements 205 are exposed.

Referring to FIGS. 25-29, a temporary carrier bonding and detaching process according to another embodiment of the present invention is illustrated. This embodiment is similar to the processes described above; however, the structure of the first carrier 31 and the steps of detaching the first carrier 31 are different.

Figure 25:
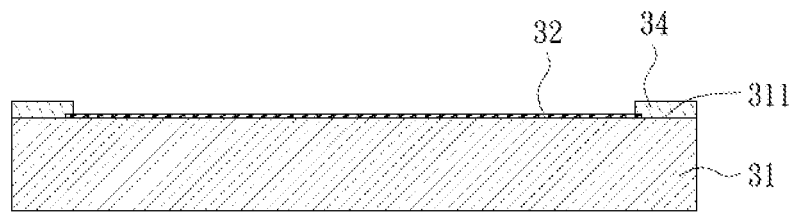
FIGS. 25-29 illustrate a temporary carrier bonding and detaching process according to another embodiment of the present invention.

Referring to FIG. 25, the first carrier 31 is provided. The first carrier 31 has a first isolation coating 32 disposed on a surface 311 thereof. In this embodiment, the first carrier 31 is a semiconductor material or insulating material such as glass, and the first isolation coating 32 is a hydrophobic coating. A first edge ring adhesive 34 is formed on the edge portion of the first carrier 31, and is in a ring shape. In this embodiment, the first edge ring adhesive 34 is a photosensitive martial, such as a positive photosensitive resist or a negative photosensitive resist, and is formed by a dry film lamination process. Preferably, the first edge ring adhesive 34 overlaps the first isolation coating 32.

Figure 26:
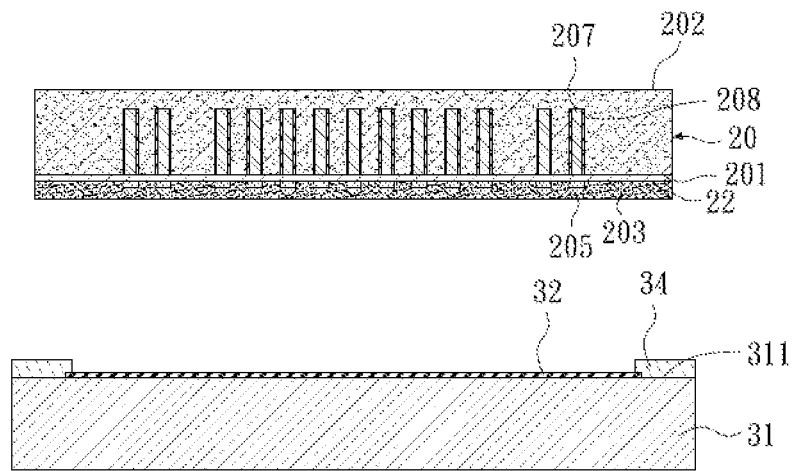

Referring to FIG. 26, the semiconductor wafer 20 (shown in a cross-sectional view) is provided. The semiconductor wafer 20 is the same as the semiconductor wafer 20 of FIG. 1, and will not be described again. Then, the first adhesive 22 is applied to the first surface 201 of the semiconductor wafer 20. In this embodiment, the first adhesive 22 is disposed on an integrated circuit 203, and includes a solvent-dissolving adhesive. Exemplary solvent-dissolving adhesives include the X5000 and X5300 brands of adhesives by SUMITOMO CHEMICAL. It is to be noted that the first adhesive 22 and the first edge ring adhesive 34 are substantially different.

Figure 27:
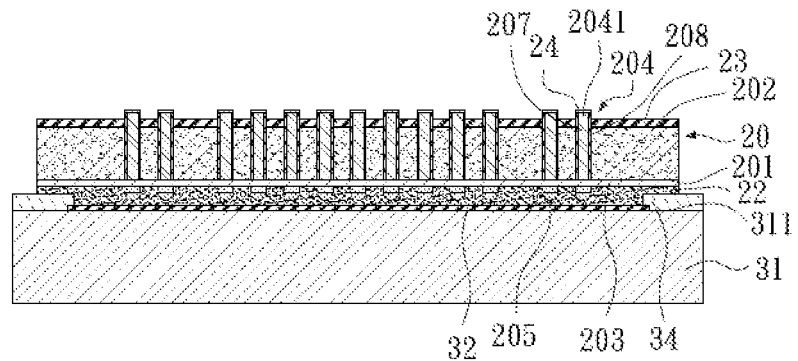

Referring to FIG. 27, the first surface 201 of the semiconductor wafer 20 is attached to the first carrier 31, and the semiconductor wafer 20 is adhered to the first carrier 31 by the first adhesive 22. In this embodiment, the first adhesive 22 contacts the first edge ring adhesive 34, and the adhesion force with respect to the first adhesive 22 and the first edge ring adhesive 34 is greater than the adhesion force with respect to the first adhesive 22 and the isolation coating 32. Then, a surface treatment is conducted on the second surface 202 of the semiconductor wafer 20 to form a plurality of conductive vias 204. Then, a passivation layer 23 is formed on the second surface 202 to cover tips 2041 of the conductive vias 204. Then, a finish layer 24 is formed on the tips 2041 of the conductive vias 204 by electroplating.

Figure 28:
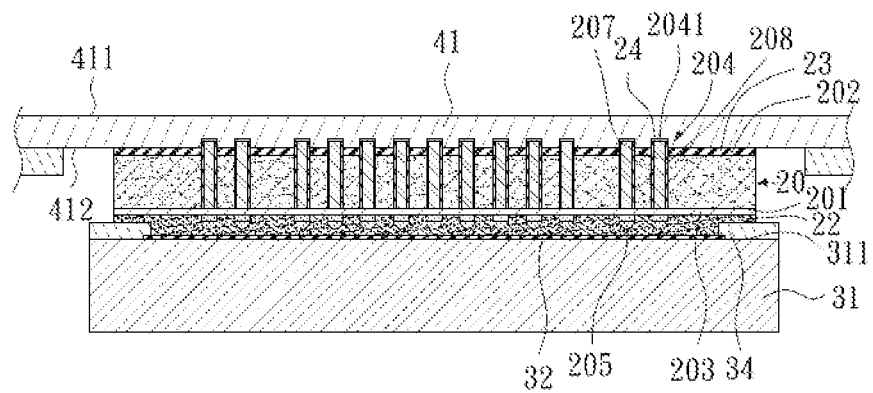

Referring to FIG. 28, a second carrier is provided. In this embodiment, the second carrier is a dicing tape 41 which has a first surface 411, a second surface 412 and an adhesive layer (not shown) disposed on the second surface 412. The second surface 412 of a dicing tape 41 is attached to the second surface 202 of the semiconductor wafer 20 through the adhesive layer (not shown) and the tips 2041 of the conductive vias 204 are embedded into the adhesive.

Figure 29:
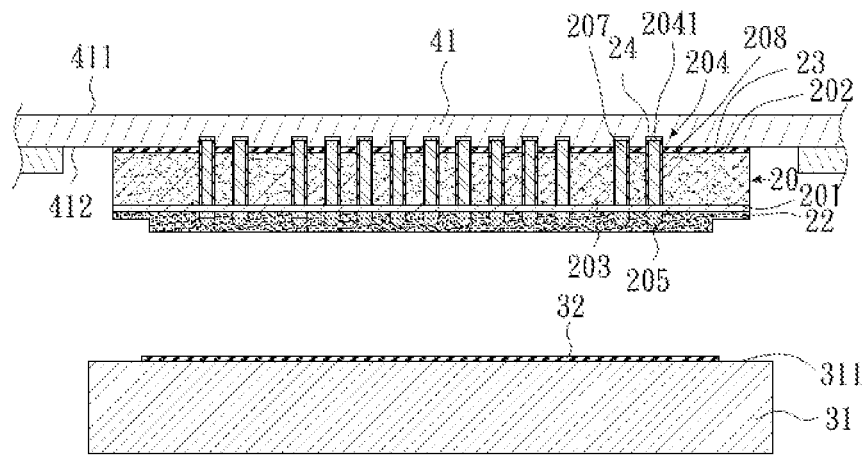

Referring to FIG. 29, the first carrier 31, the first edge ring adhesive 34, and the semiconductor wafer 20 are then immersed into an alkaline solution, such as tetramethylammonium hydroxide solution ($TMAH_{(aq)}$) or sodium hydroxide solution ($NaOH_{(aq)}$), and the first edge ring adhesive 34 is dissolved by the alkaline solution. Then, the first carrier 31 and the first isolation coating 32 are detached from the semiconductor wafer 20 simultaneously. The dicing tape 41 remains with the semiconductor wafer 20 so as to permit the semiconductor wafer 20 to be handled and/or transported from one manufacturing station to another. After detaching the first carrier 31, the residual first adhesive 22 are removed from the semiconductor wafer 20 so that the conductive elements 205 are exposed.

Figure 30:
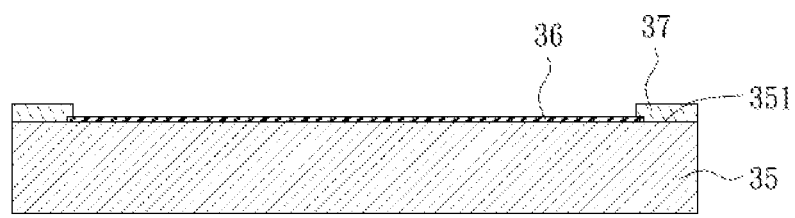
FIGS. 30-32 illustrate a temporary carrier bonding and detaching process according to another embodiment of the present invention.
Figure 31:
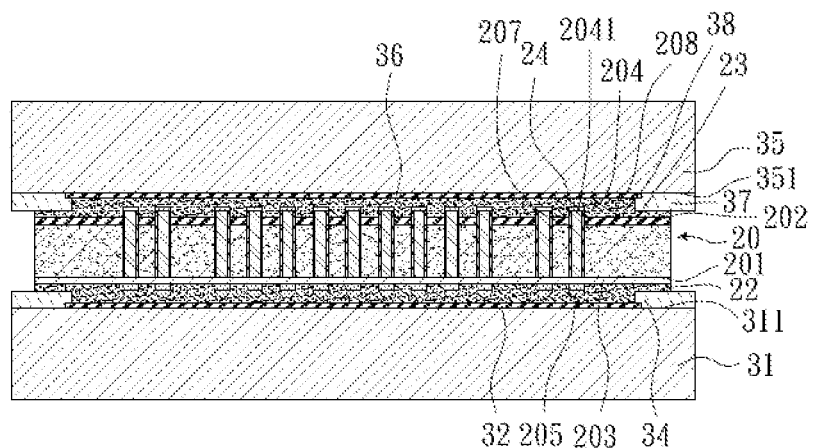
Figure 32:
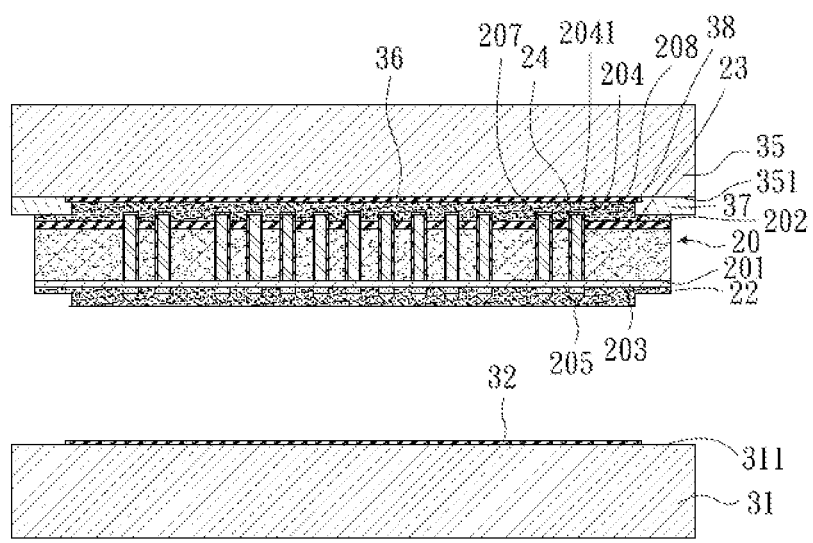

Referring to FIGS. 30-32, a temporary carrier bonding and detaching process according to another embodiment of the present invention is illustrated. This embodiment is similar to the processes described above; however, the steps of applying a second carrier are different.

Referring to FIG. 30, a second carrier 35 is provided, which can be a semiconductor material or insulating material such as glass. The second carrier 35 has a surface 351. Then, a second isolation coating 36 and a second edge ring adhesive 37 is formed on the surface 351 of the second carrier 35, wherein the second edge ring adhesive 37 surrounds and contacts the second isolation coating 36. Preferably, the second edge ring adhesive 37 overlaps the second isolation coating 36. In this embodiment, the method of forming the second edge ring adhesive 37 is the same as the method of forming the first edge ring adhesive 34, as shown in FIG. 25. In this embodiment, the material of the second edge ring adhesive 37 may be the same with or different from the material of first edge ring adhesive 34.

Referring to FIG. 31, the second carrier 35 is attached to the second surface 202 of the semiconductor wafer 20 by using a second adhesive 38. In this embodiment, the adhesion force with respect to the second adhesive 38 and the second edge ring adhesive 37 is greater than the adhesion force with respect to the second adhesive 38 and the second isolation coating 36.

Referring to FIG. 32, the first edge ring adhesive 34, the first adhesive layer 22 and the first carrier 31 are then immersed into an alkaline solution, such as, tetramethylammonium hydroxide solution (TMAH$_{(aq)}$) or sodium hydroxide solution (NaOH$_{(aq)}$), and the first edge ring adhesive 34 is dissolved by the alkaline solution, thus, the first carrier 31 and the first isolation coating 32 are detached from the semiconductor wafer 20 simultaneously. The second carrier 35 remains with the semiconductor wafer 20 so as to permit the semiconductor wafer 20 to be handled and/or transported from one manufacturing station to another. After detaching the first carrier 31, the residual first adhesive 22 is removed from the semiconductor wafer 20 so that the conductive elements 205 are exposed.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A method for handling a semiconductor wafer, comprising:
    attaching a carrier to an active surface of the semiconductor wafer using an adhesive, wherein the adhesive bonds the active surface of the semiconductor wafer to an isolation coating disposed on a surface of the carrier and a portion of the surface of the carrier not having the isolation coating, the adhesive strength of the bond between the active surface of the semiconductor wafer and the isolation coating substantially less than the adhesive strength of the bond between the semiconductor wafer and the portion of the surface of the carrier not having the isolation coating;
    separating the semiconductor wafer into an inner portion and an outer portion, the carrier requiring substantially less pulling force to be removed from the inner portion than the outer portion; and
    removing the carrier from the inner portion of the semiconductor wafer.

2. The method of claim 1, wherein separating the semiconductor wafer into the inner portion and the outer portion includes cutting the semiconductor wafer into the inner portion and the outer portion using a blade or a laser.

3. The method of claim 1, wherein separating the semiconductor wafer into the inner portion and the outer portion exposes the isolation coating disposed on the surface of the carrier.

4. The method of claim 1, wherein removing the carrier from the inner portion of the semiconductor wafer includes applying a pulling force to the carrier.

5. The method of claim 1, wherein the isolation coating is a hydrophobic coating.

6. The method of claim 1, further comprising:
    after attaching the carrier to the semiconductor wafer,
        exposing a tip of at least one conductive pillar formed in the semiconductor wafer by removing a portion of an inactive surface of the semiconductor wafer;
        covering the exposed tips with a passivation layer; and
        thinning the passivation layer so that the tips protrude from the passivation layer.

7. The method of claim 1, further comprising:
    attaching an inactive surface of the semiconductor wafer to a first surface of a dicing tape;
    forming a cover layer on a second surface of the dicing tape, wherein the cover layer corresponds to the inner portion of the semiconductor wafer; and
    illuminating the second surface of the dicing tape by an ultraviolet light, wherein the second surface of the dicing tape that is outside the cover layer becomes weakly adhesive.

8. The method of claim 1, wherein separating the semiconductor wafer includes forming a circular groove dividing the inner portion and the outer portion, the depth of the circular groove equal to the sum of a thickness of the semiconductor wafer, a thickness of an adhesive and a tolerance.

9. The method of claim 7, wherein a distance between the circular groove and an edge of the semiconductor wafer is greater than a distance between an edge of an isolation coating and the edge of the semiconductor wafer.

10. The method of claim 1, further comprising the step of removing adhesive from the semiconductor wafer.

11. The method of claim 1, wherein the active surface includes an electrical component.

12. The method of claim 1, wherein the active surface includes an integrated circuit.

\* \* \* \* \*